(12) United States Patent
Snyder et al.

(10) Patent No.: US 7,307,485 B1
(45) Date of Patent: Dec. 11, 2007

(54) CAPACITANCE SENSOR USING RELAXATION OSCILLATORS

(75) Inventors: Warren S. Snyder, Snohomish, WA (US); David Van Ess, Arlington, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 64 days.

(21) Appl. No.: 11/273,708

(22) Filed: Nov. 14, 2005

(51) Int. Cl.
*H03K 3/02* (2006.01)
*G01R 27/26* (2006.01)

(52) U.S. Cl. .................... 331/150; 324/548; 324/658; 324/678

(58) Field of Classification Search ................ 331/150; 324/548, 658, 678
See application file for complete search history.

(56) References Cited

U.S. PATENT DOCUMENTS

| | | |
|---|---|---|
| 4,283,713 A | 8/1981 | Philipp |
| 4,438,404 A | 3/1984 | Philipp |
| 4,475,151 A | 10/1984 | Philipp |
| 4,497,575 A | 2/1985 | Philipp |
| 4,736,097 A | 4/1988 | Philipp |
| 4,773,024 A | 9/1988 | Faggin et al. |
| 4,802,103 A | 1/1989 | Faggin et al. |
| 4,876,534 A | 10/1989 | Mead et al. |
| 4,879,461 A | 11/1989 | Philipp |
| 4,935,702 A | 6/1990 | Mead et al. |
| 4,953,928 A | 9/1990 | Anderson et al. |
| 4,962,342 A | 10/1990 | Mead et al. |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |

(Continued)

OTHER PUBLICATIONS

Sedra, Adel S. et al., "Microelectronic Circuits," 3rd Edition, Oxford University Press, pp. xiii-xx and 861-883, 1991.

(Continued)

*Primary Examiner*—Benny T. Lee
*Assistant Examiner*—Levi Gannon
(74) *Attorney, Agent, or Firm*—Blakely, Sokoloff, Taylor & Zafman LLP (57) ABSTRACT

An apparatus that may be used to sense capacitance, as well as other functions. The apparatus includes a comparator circuit with hysteresis, a capacitor, and a current driver. The comparator circuit with hysteresis includes a first input and an output. The capacitor is coupled to the first input of the comparator circuit with hysteresis. The current driver is coupled to the output of the comparator circuit with hysteresis and to the capacitor. The current driver reciprocally sources and sinks a drive current through a terminal of the capacitor to oscillate a voltage potential at the terminal of the capacitor between a low reference potential and a high reference potential. The current driver is responsive to the output of the comparator circuit with hysteresis.

20 Claims, 6 Drawing Sheets

U.S. PATENT DOCUMENTS

| | | |
|---|---|---|
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,289,023 A | 2/1994 | Mead |
| 5,303,329 A | 4/1994 | Mead et al. |
| 5,305,017 A | 4/1994 | Gerphide |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,374,787 A | 12/1994 | Miller et al. |
| 5,381,515 A | 1/1995 | Platt et al. |
| 5,384,467 A | 1/1995 | Plimon et al. |
| 5,408,194 A | 4/1995 | Steinbach et al. |
| 5,488,204 A | 1/1996 | Mead et al. |
| 5,495,077 A | 2/1996 | Miller et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,629,891 A | 5/1997 | LeMoncheck et al. |
| 5,648,642 A | 7/1997 | Miller et al. |
| 5,670,915 A * | 9/1997 | Cooper et al. ............... 331/111 |
| 5,682,032 A | 10/1997 | Philipp |
| 5,730,165 A | 3/1998 | Philipp |
| 5,757,368 A | 5/1998 | Gerpheide et al. |
| 5,763,909 A | 6/1998 | Mead et al. |
| 5,767,457 A | 6/1998 | Gerpheide et al. |
| 5,796,183 A | 8/1998 | Hourmand |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,914,465 A | 6/1999 | Allen et al. |
| 5,914,708 A | 6/1999 | LaGrange et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,097,432 A | 8/2000 | Mead et al. |
| 6,148,104 A | 11/2000 | Wang et al. |
| 6,185,450 B1 | 2/2001 | Seguine et al. |
| 6,188,228 B1 | 2/2001 | Philipp |
| 6,188,391 B1 | 2/2001 | Seely et al. |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,280,391 B1 | 8/2001 | Olson et al. |
| 6,288,707 B1 | 9/2001 | Philipp |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 * | 12/2001 | Goldman et al. ........... 331/143 |
| 6,377,009 B1 | 4/2002 | Philipp |
| 6,380,929 B1 | 4/2002 | Platt |
| 6,380,931 B1 | 4/2002 | Gillespie et al. |
| 6,414,671 B1 | 7/2002 | Gillespie et al. |
| 6,430,305 B1 | 8/2002 | Decker |
| 6,441,073 B1 | 8/2002 | Tanaka et al. |
| 6,452,514 B1 | 9/2002 | Philipp |
| 6,457,355 B1 | 10/2002 | Philipp |
| 6,466,036 B1 | 10/2002 | Philipp |
| 6,473,069 B1 | 10/2002 | Gerpheide |
| 6,489,899 B1 | 12/2002 | Ely et al. |
| 6,498,720 B2 | 12/2002 | Glad |
| 6,499,359 B1 | 12/2002 | Washeleski et al. |
| 6,522,128 B1 | 2/2003 | Ely et al. |
| 6,523,416 B2 | 2/2003 | Takagi et al. |
| 6,534,970 B1 | 3/2003 | Ely et al. |
| 6,535,200 B2 | 3/2003 | Philipp |
| 6,570,557 B1 | 5/2003 | Westerman et al. |
| 6,587,093 B1 | 7/2003 | Shaw et al. |
| 6,610,936 B2 | 8/2003 | Gillespie et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,705,511 B1 | 3/2004 | Dames et al. |
| 6,714,817 B2 | 3/2004 | Daynes et al. |
| 6,730,863 B1 | 5/2004 | Gerpheide et al. |
| 6,750,852 B2 | 6/2004 | Gillespie et al. |
| 6,788,221 B1 | 9/2004 | Ely et al. |
| 6,798,218 B2 * | 9/2004 | Kasperkovitz ............... 324/658 |
| 6,809,275 B1 | 10/2004 | Cheng et al. |
| 6,856,433 B2 | 2/2005 | Hatano et al. |
| 6,873,203 B1 | 3/2005 | Latham, II et al. |
| 6,888,538 B2 | 5/2005 | Ely et al. |
| 6,893,724 B2 | 5/2005 | Lin et al. |
| 6,969,978 B2 * | 11/2005 | Dening ....................... 323/282 |
| 6,975,123 B1 | 12/2005 | Malang et al. |
| 7,119,550 B2 * | 10/2006 | Kitano et al. ............... 324/658 |
| 2002/0063688 A1 | 5/2002 | Shaw et al. |
| 2002/0191029 A1 | 12/2002 | Gillespie et al. |
| 2003/0025679 A1 | 2/2003 | Taylor et al. |
| 2003/0062889 A1 | 4/2003 | Ely et al. |
| 2003/0063428 A1 | 4/2003 | Nishi |
| 2003/0080755 A1 | 5/2003 | Kobayashi |
| 2003/0156098 A1 | 8/2003 | Shaw et al. |
| 2003/0160808 A1 | 8/2003 | Foote et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2004/0169594 A1 | 9/2004 | Ely et al. |
| 2004/0178997 A1 | 9/2004 | Gillespie et al. |
| 2004/0252109 A1 | 12/2004 | Trent, Jr. et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2006/0032680 A1 | 2/2006 | Elias et al. |
| 2006/0097991 A1 | 5/2006 | Hotelling et al. |
| 2006/0113974 A1 | 6/2006 | Kan et al. |
| 2006/0164142 A1 | 7/2006 | Stanley |

2006/0273804 A1 12/2006 Delorme et al.

OTHER PUBLICATIONS

Van Ess, David, "Simulating a 555 Timer with PSoC™," Cypress Semiconductor Corporation, Application Note AN2286, pp. 1-10, May 19, 2005.

Cypress Semiconductor Corporation, "FAN Controller CG6457AM and CG6462AM," PSoC™ Mixed-Signal Array Preliminary Data Sheet, pp. 1-25, May 24, 2005.

Cypress Semiconductor Corporation, "PsoC Mixed-Signal Controllers," Product Description, pp. 1-2, http://www.cypress.com/portal/server.pt?space=CommunityPage&control=SetCommunity&CommunityID=209&PageID=215&gid=13&fid=24&category=false. (Sep. 27, 2005).

Cypress Semiconductor Corporation, "CY8C21x34 Data Sheet," CSR User Module, CSR V.1.0, Oct. 6, 2005, pp. 1-36.

Chapweske, Adam, "The PS/2 Mouse Interface," PS/2 Mouse Interfacing, 2001.

Cypress Semiconductor Corporation, "Cypress Introduces PSoC(TM)-Based Capacitive Touch Sensor Solution", Cypress Press Release, May 31, 2005, http://www.cypress.com/portal/server.pt?space=CommunityPage&contol=SetCommunity&CommunityID=208&PageID=218&DirectoryID=661552 (Retrieved on Feb. 5, 2007).

Seguine, Ryan, "Layout Guidelines for PSoC™ CapSense™," Cypress Semiconductor Corporation, Application Note AN2292, pp. 1-10, Jul. 22, 2005.

Lee, Mark, "EMC Design considerations for PsoC™ CapSense™ Applications," Cypress Semiconductor Corporation, Application Note AN2318, pp. 1-6, Sep. 16, 2005.

Cypress Semiconductor Corporation, "Release Note srn017," pp. 1-3, Jan. 24, 2007.

Cypress Semiconductor Corporation, "PSoC® CY8C20x34 Technical Reference Manual (TRM)," PSoC CY8C20x34 TRM, Version 1.0, pp. 1-218, 2006.

* cited by examiner

CAPACITANCE SENSOR USING RELAXATION OSCILLATORS

TECHNICAL FIELD

This disclosure relates generally to relaxation oscillators, and in particular but not exclusively, relates to a dual coupled relaxation oscillators for use in a capacitance sensor.

BACKGROUND INFORMATION

Figure 1:
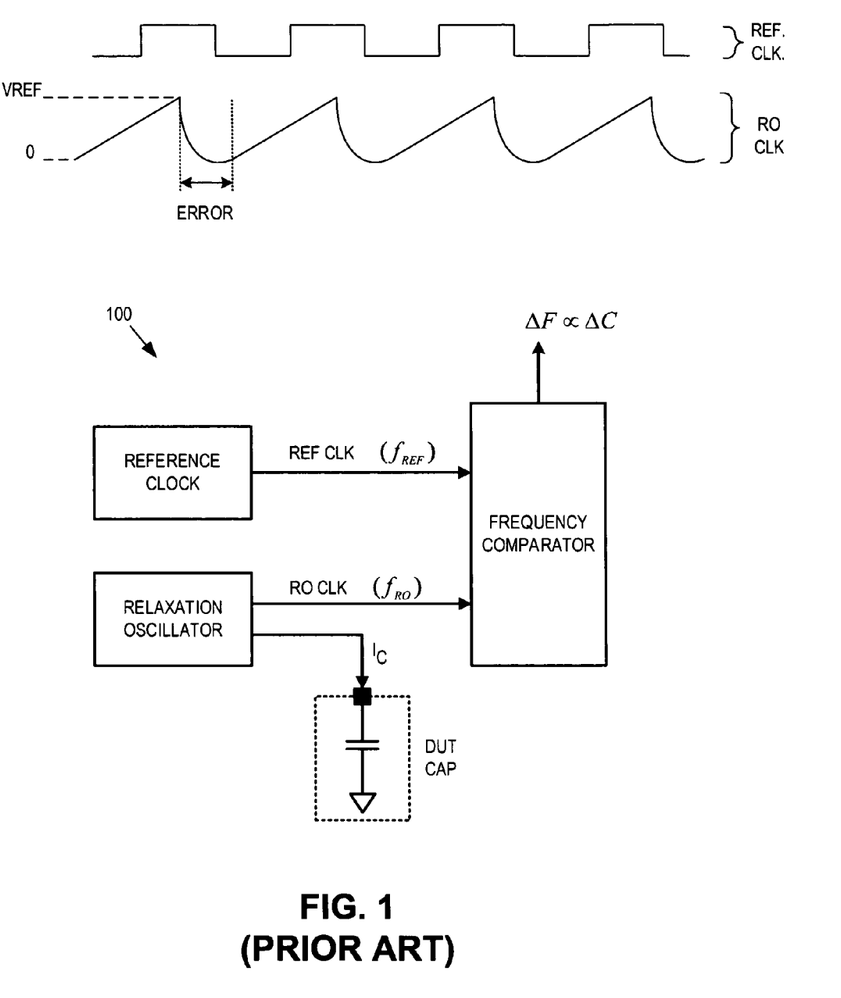
FIG. 1 is a block diagram illustrating a conventional capacitance sensor and timing diagram illustrating operation of the conventional capacitance sensor.

Capacitance sensors are used to implement a variety of useful functions including touch sensors (e.g., touch pad, touch dial, touch wheel, etc.), determining the presence of an object, accelerometers, and other functions. FIG. 1 illustrates a conventional capacitance sensor 100 including a relaxation oscillator, a reference clock, and a frequency comparator. The relaxation oscillator is coupled to drive a charging current (Ic) in a single direction onto a device under test ("DUT") capacitor. As the charging current piles charge onto the DUT capacitor, the voltage across the capacitor increases with time as a function of Ic and its capacitance C. Equation 1 describes the relation between current, capacitance, voltage and time for a charging capacitor.

$$CdV = I_C dt \qquad \text{(Equation 1)}$$

The relaxation oscillator begins by charging the DUT capacitor from a ground potential or zero voltage and continues to pile charge on the DUT capacitor at a fixed charging current Ic until the voltage across the DUT capacitor reaches a reference voltage (Vref). At Vref, the relaxation oscillator allows the accumulated charge to discharge or the DUT capacitor to "relax" back to the ground potential and then the process repeats itself. The relaxation oscillator outputs a relaxation oscillator clock signal (RO CLK) having a frequency ($f_{RO}$) dependent upon capacitance C of the DUT capacitor and charging current Ic.

If capacitance C of the DUT capacitor changes, then $f_{RO}$ will change proportionally according to Equation 1. By comparing $f_{RO}$ of RO CLK against the frequency ($f_{REF}$) of a known reference clock signal (REF CLK), the change in capacitance $\Delta C$ can be measured. Accordingly, equations 2 and 3 below describe that a change in frequency between RO CLK and REF CLK is proportional to a change in capacitance of the DUT capacitor.

$$\Delta C \propto \Delta f, \text{ where} \qquad \text{(Equation 2)}$$

$$\Delta f = f_{RO} - f_{REF}. \qquad \text{(Equation 3)}$$

The frequency comparator is coupled to receive RO CLK and REF CLK, compare their frequencies $f_{RO}$ and $f_{REF}$, respectively, and output a signal indicative of the difference $\Delta f$ between these frequencies. By monitoring $\Delta f$ one can determine whether the capacitance of the DUT capacitor has changed.

However, during the relaxation of the DUT capacitor, the discharge current is not fixed and therefore the relaxation phase generates an error. As frequency $f_{RO}$ of RO CLK is increased (e.g., by increasing charging current Ic) the relaxation error becomes a more significant portion of the overall clock cycle. As such, the relaxation error is a frequency limiting factor that places an upper bound on the operational frequency of capacitance sensor 100. Operating at lower $f_{RO}$ frequencies leaves capacitance sensor 100 more susceptible to low frequency noise. Furthermore, since the frequency $f_{RO}$ of RO CLK is unrelated to the frequency $f_{REF}$ of REF CLK, capacitance sensor 100 is susceptible to frequency wandering due to temperature drift.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a apparatus and method for are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
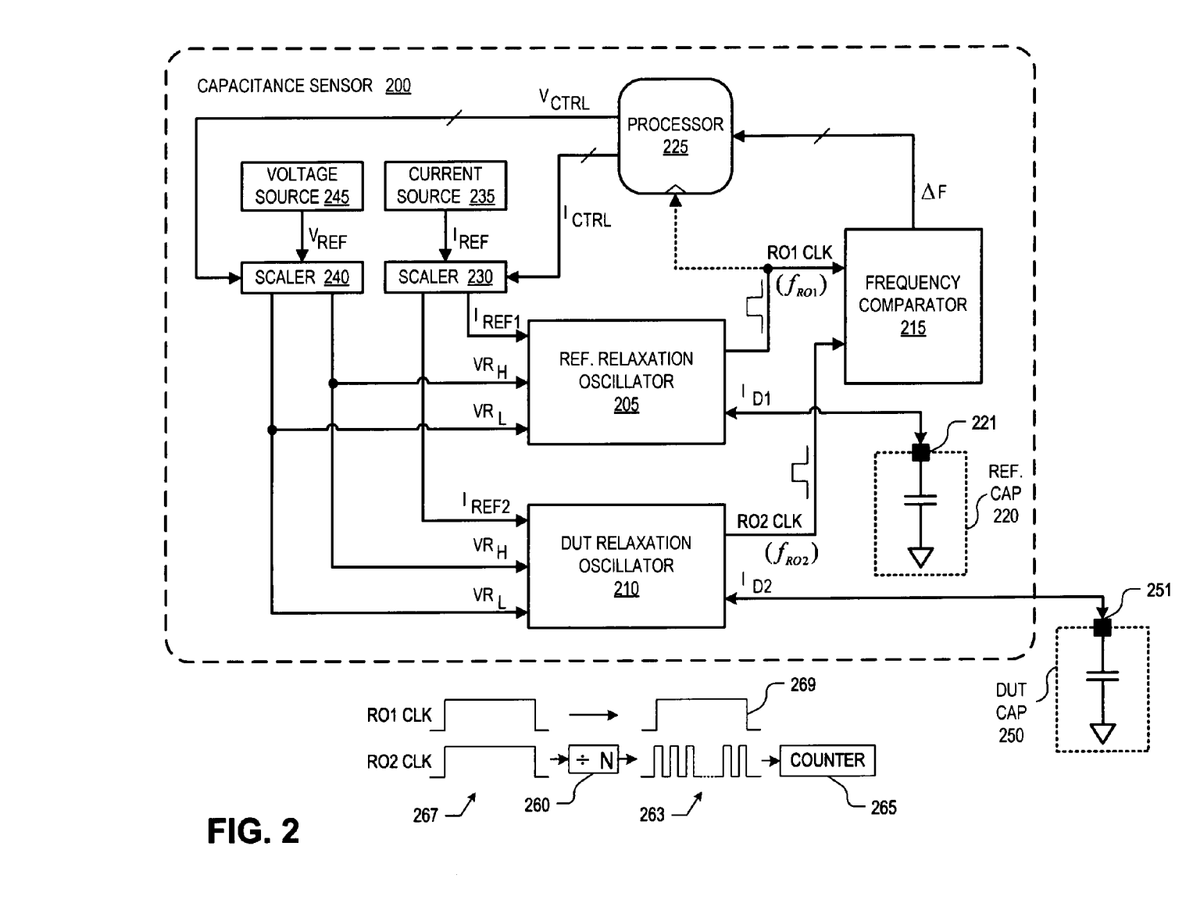
FIG. 2 is a functional block diagram illustrating a capacitance sensor implemented with dual relaxation oscillators, in accordance with an embodiment of the invention.

FIG. 2 is a functional block diagram illustrating a capacitance sensor 200 implemented with dual relaxation oscillators, in accordance with an embodiment of the invention. The illustrated embodiment of capacitance sensor 200 includes a reference relaxation oscillator (REF RO) 205, a device under test ("DUT") relaxation oscillator (DUT RO) 210, a frequency comparator 215, a reference capacitor 220, a processor 225, a scaler 230, a current source 235, a scaler 240, and a voltage source 245. Capacitance sensor 200 may be used to monitor, sense, and/or measure the absolute capacitance C or the change in the capacitance $\Delta C$ of a DUT capacitor 250.

The components of capacitance sensor 200 are coupled and interact as follows. REF RO 205 is coupled to a terminal 221 of reference capacitor 220. REF RO 205 generates a drive current $I_{D1}$ into and out of terminal 221 to reciprocally charge and discharge reference capacitor 220. Since REF RO 205 sources and sinks drive current $I_{D1}$ to/from reference capacitor 220, the frequency of charging and discharging reference capacitor 220 does not suffer from an upper bound due to a relaxation phase error. DUT RO 210 operates in a similar manner to REF RO 205, except DUT RO 210 is coupled to a terminal 251 of DUT capacitor 250 to reciprocally charge and discharge DUT capacitor 250 with a drive current $I_{D2}$. During the process of charging and discharging reference capacitor 220, REF RO 205 outputs a clock signal RO1 CLK having a frequency $f_{RO1}$. RO1 CLK tracks the charging and discharging of reference capacitor 220 and therefore $f_{RO1}$ is substantially equal to the frequency at which reference capacitor 220 is charged and discharged. Similarly, DUT RO 210 output a clock signal RO2 CLK having a frequency $f_{RO2}$. RO2 CLK tracks the charging and discharging of DUT capacitor 220 and therefore $f_{RO2}$ is substantially equal to the frequency at which DUT capacitor 250 is charged and discharged.

Frequency comparator 215 (also referred to as a frequency discriminator) is coupled to REF RO 205 and DUT RO 210 to receive RO1 CLK and RO2 CLK. Frequency comparator 215 outputs a comparison signal ($\Delta f$) being indicative of a difference in frequency between $f_{RO1}$ and $f_{RO2}$ or indicative of a period difference between RO1 CLK and RO2 CLK. Since frequency and period are inversely related, it should be appreciated determining a frequency difference between RO1 CLK and RO2 CLK is defined herein to include measuring the frequency difference or measuring the period difference. In one embodiment, frequency comparator 215 includes a divider circuit 260 and a N-bit register counter 265. Divider circuit 260 is coupled to receive RO2 CLK from DUT RO 210 and to divide RO2 CLK by $2^N$ to generate $2^N$ pulses 263 for each input pulse 267 of RO2 CLK. N-bit register counter 265 then counts the number of pulses 263 that occur during a single pulse 269 or cycle of RO1 CLK. By selecting N (e.g., N=8), the sensitivity or resolution of capacitance sensor 200 may be adjusted.

As described above in connection with Equation 2, a change in relative frequency is related to the change in capacitance $\Delta C$ of DUT capacitor 250. Accordingly, capacitance sensor 200 may be used to sense a capacitance change in DUT capacitor 250. For example, capacitance sensor 200 may be used to implement a user interface, such as a touch pad or touch dial, where the presence or absence of a user's finger on the touch pad/dial alters the capacitance of DUT capacitor 250. Capacitance sensor 200 may further be used to implement other functions including determining the presence of an object, accelerometers, and other capacitance sensing apparatuses. Furthermore, as discussed below, capacitance sensor 200 may be used in test equipment for measuring the absolute capacitance of DUT capacitor 250.

In the illustrated embodiment, comparison signal $\Delta f$ is coupled into processor 225. Processor 225 may perform various filtering functions on comparison signal $\Delta f$ and use comparison signal $\Delta f$ to implement a user interface or other functions.

In one embodiment, processor 225 controls operation of REF RO 205 and DUT RO 210 via a control signal $I_{CTRL}$ output to scaler 230. Control signal $I_{CTRL}$ selects a scaling factor for scaling a reference current $I_{REF}$ received from current source 235 for generating individual reference currents $I_{REF1}$ and $I_{REF2}$. Reference currents $I_{REF1}$ and $I_{REF2}$ drive REF RO 205 and DUT RO 210, respectively. In one embodiment, control signal $I_{CTRL}$ includes two 8-bit values, one each for selecting $I_{REF1}$ and $I_{REF2}$, and scalers 230 and 240 include digital-to-analog converters ("DACs").

As discussed below, $I_{REF1}$ and $I_{REF2}$ may be mirrored by each of REF RO 205 and DUT RO 210, respectively, to generate drive currents $I_{D1}$ and $I_{D2}$. It should be appreciated that "mirroring" a reference current $I_{REF1}$ or $I_{REF2}$ to generate drive currents $I_{D1}$ and $I_{D2}$ means that $I_{D1}$ and $I_{D2}$ are related to $I_{REF1}$ or $I_{REF2}$ by a multiplying factor $k_1$ or $k_2$, respectively, where $k_1$ or $k_2$ may be greater than, less than, or equal to one. For example, $k_1$ and $k_2$, may be equal to the ratio of the widths and lengths of the transistors used to implement a current mirroring circuit within each of REF RO 205 and DUT RO 210

In one embodiment, $I_{REF1}$ and $I_{REF2}$ are identical. In an alternative embodiment, $I_{REF1}$ and/or $I_{REF2}$ are independently scalable in response to $I_{CTRL}$. $I_{REF2}$ received by DUT RO 210 can be trimmed with respect to $I_{REF1}$ to compensate for baseline or nominal differences in the capacitances between reference capacitor 220 and DUT capacitor 250. $I_{REF2}$ received at DUT RO 210 can be trimmed until the frequency $f_{RO2}$ of RO2 CLK is equal to the frequency $f_{RO1}$ of RO1 CLK. By measuring the amount of trim or offset between $I_{REF1}$ and $I_{REF2}$ when $f_{RO2}=f_{RO1}$ and knowing the fixed capacitance of reference capacitor 220, capacitance sensor 200 may be used to measure the absolute capacitance C of DUT capacitor 250.

In one embodiment, processor 225 further controls operation of REF RO 205 and DUT RO 210 via a control signal $V_{CTRL}$ output to scaler 240. Scaler 240 scales the reference voltage $V_{REF}$ received from voltage source 245 to generate a low voltage reference $VR_L$ and a high voltage reference $VR_H$. Processor 225 may output control signal $V_{CTRL}$ to scaler 240 to independently select low voltage reference $VR_L$ and high voltage reference $VR_H$. In one embodiment, control signal $V_{CTRL}$ may represent two 8-bit values, one to control low voltage reference $VR_L$ and one to control high voltage reference $VR_H$.

Low voltage reference $VR_L$ is used by REF RO 205 and DUT RO 210 to set the low voltage trip point where the oscillators switch between discharging and charging their respective capacitors (i.e., reference capacitor 220 and DUT capacitor 250). High voltage reference $VR_H$ is used by REF RO 205 and DUT RO 210 to set the high voltage trip point where the oscillators switch between charging and discharging their respective capacitors. Accordingly, embodiments of capacitance sensor 200 enable processor 225 to select the low-side and high-side voltages between which reference capacitor 220 and DUT capacitor 250 oscillate. Processor 225 can change low voltage reference $VR_L$ and high voltage reference $VR_H$ to increase or decrease the voltage swings on reference capacitor 220 and DUT capacitor 250 and/or translate the oscillating voltage range up or down.

In one embodiment, REF RO 205 and DUT RO 210 are matched or symmetrically balanced relaxation oscillators. By using matched relaxation oscillators, environmental changes (e.g., temperature, voltage, and current drifts) affect each oscillator in a similar manner. Since scaler 230 generates $I_{REF1}$ and $I_{REF2}$ based on a single reference current $I_{REF}$, fluctuations in reference current $I_{REF}$ are equally reflected in both $I_{REF1}$ and $I_{REF2}$. Therefore, any affect due to environmental changes is substantially equivalent across both REF RO 205 and DUT RO 210 and cancelled out or rejected by frequency comparator 215.

Figure 3:
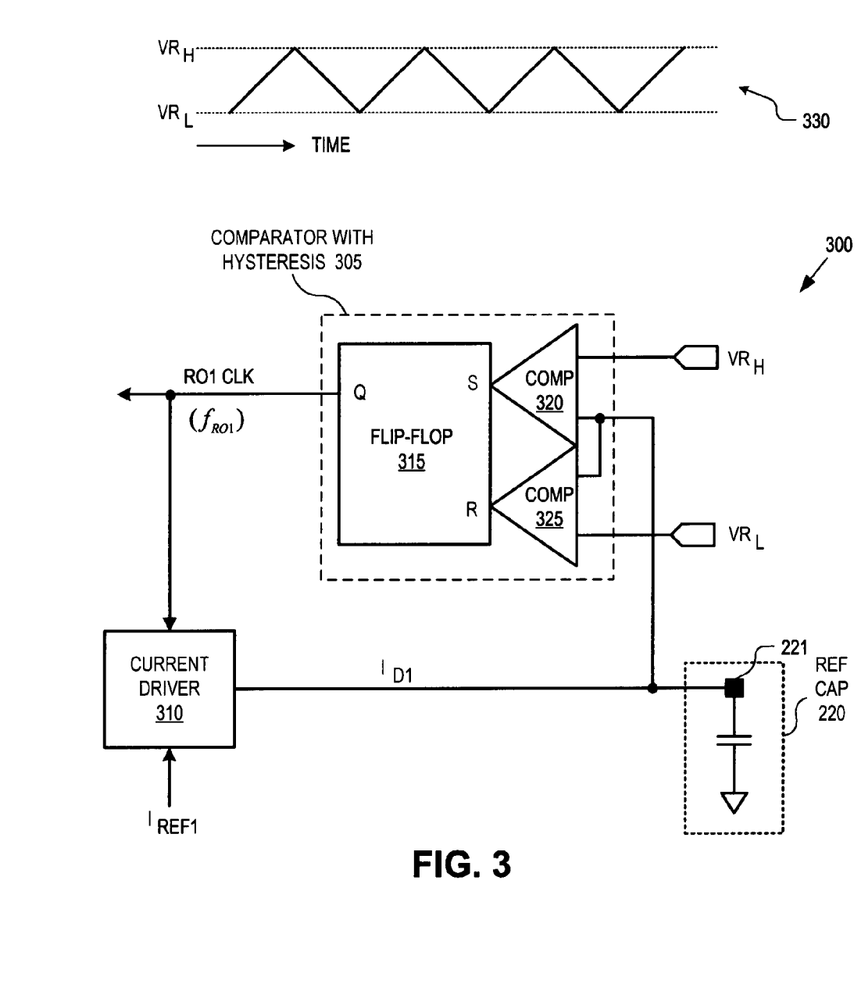
FIG. 3 is a functional block diagram illustrating a relaxation oscillator, in accordance with an embodiment of the invention.

FIG. 3 is a functional block diagram illustrating a relaxation oscillator 300, in accordance with an embodiment of the invention. Relaxation oscillator 300 is one possible embodiment of REF RO 205 or DUT RO 210. Although relaxation oscillator 300 is illustrated as coupled to reference capacitor 220, it should be appreciated that it may also be coupled to DUT capacitor 250. Relaxation oscillator 300 includes a comparator with hysteresis 305 and current driver 310. The illustrated embodiment of comparator with hysteresis 305 includes a flip-flop 315, a comparator 320, and a comparator 325.

The components of relaxation oscillator 300 are interconnected as follows. Comparators 320 and 325 have one input tied to each other while one input of comparator 320 is coupled to high reference voltage $VR_H$ and one input of comparator 325 is coupled to low reference voltage $VR_L$. The output of comparator 320 is coupled to the 'S' (set) input of flip-flop 315 and the output of comparator 325 is coupled to the 'R' (reset) input of flip-flop 315. An output 'Q' of flip-flop 315 is coupled to an input of current driver 310 to control when current driver 310 source or sinks drive current $I_{D1}$ through terminal 221.

During operation, current driver 310 reciprocally charges and discharges capacitor 220 as illustrated in line chart 330 between $VR_L$ and $VR_H$. The values of $VR_H$ and $VR_L$ are selectable to set the high and low voltage potential between which relaxation oscillator 300 oscillates terminal 221 of reference capacitor 220. Current driver 310 changes between sourcing drive current $I_{D1}$ into terminal 221 and sinking drive current $I_{D1}$ from terminal 221 under control of output Q of flip-flop 315.

Figure 4:
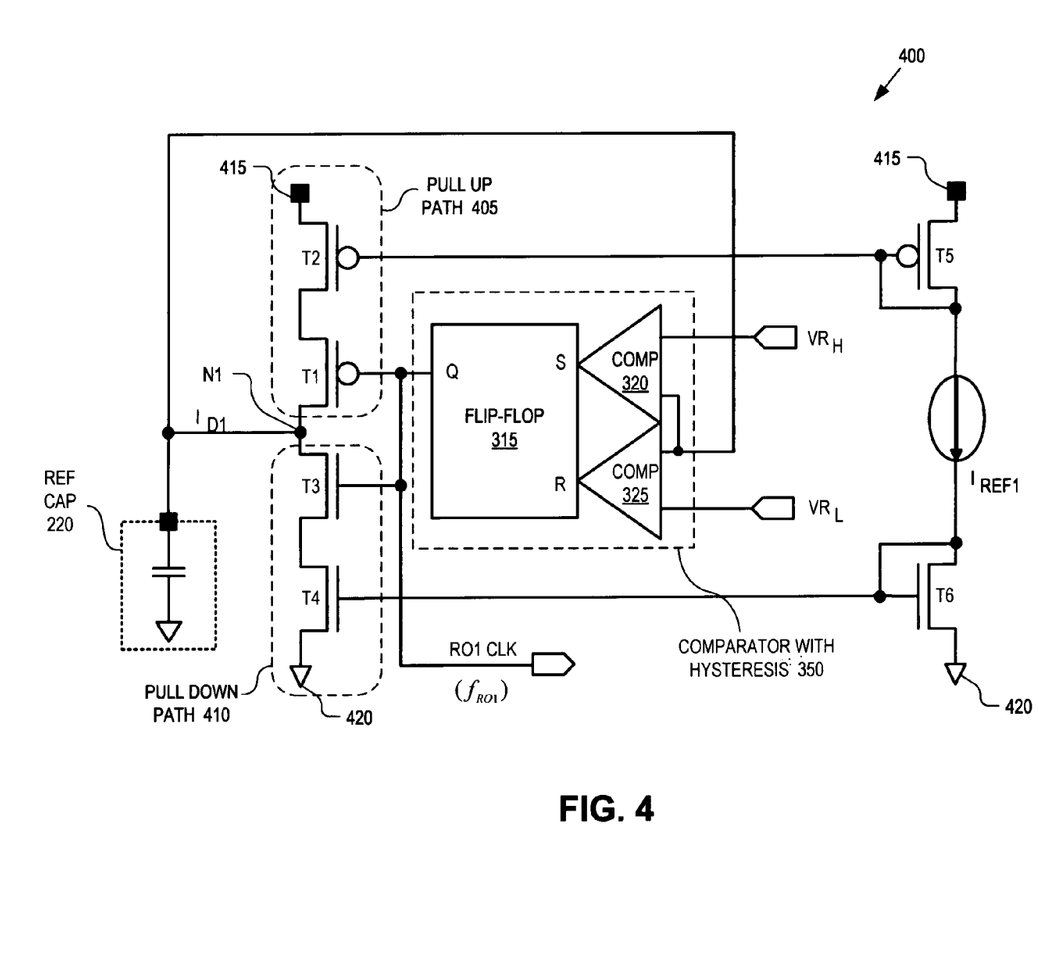
FIG. 4 is a circuit schematic of a relaxation oscillator, in accordance with an embodiment of the invention.

FIG. 4 is a circuit schematic of a relaxation oscillator 400, in accordance with an embodiment of the invention. Relaxation oscillator 400 is similar to relaxation oscillator 300; however, relaxation oscillator 400 illustrates internal components of one possible embodiment of current driver 310.

A pull up path 405 and a pull down path 410 are coupled to the output Q of flip-flop 315 to selectively source or sink drive current $I_{D1}$. Pull up path 405 includes two positive metal oxide semiconductor ("PMOS") field effect transistor ("FETs") coupled in series between a high voltage rail 415 and a node N1. Pull up path 405 is coupled to node N1 to selectively source drive current $I_{D1}$ into reference capacitor 220. Pull down path 410 includes two negative metal oxide semiconductor ("NMOS") FETs coupled in series between node N1 and a low voltage rail 420. Pull down path 410 is coupled to node N1 to selectively sink drive current $I_{D1}$ from reference capacitor 220. Output Q of flip-flop 315 is coupled to the gate of PMOS transistor T1 in pull up path 405 and to the gate of NMOS transistor T3 in pull down path 410 to reciprocally turn on and off each of the current paths to reciprocally source and sink drive current $I_{D1}$ through node N1.

Relaxation oscillator 400 further includes two current mirror circuits to mirror reference current $I_{REF1}$ into pull up path 405 and pull down path 410 for generating drive current $I_{D1}$. The first current mirror circuit includes a PMOS transistor T5 having its drain and gate clamped and its source coupled to high voltage rail 415. The gate of transistor T5 is further coupled to a gate of transistor T2 of pull up path 405 to implement the current mirroring function. The second current mirror circuit includes a NMOS transistor T6 having its drain and gate clamped and its source coupled to low voltage rail 420. The gate of transistor T6 is further coupled to a gate of transistor T4 of pull down path 410 to implement the current mirroring function.

By driving $I_{D1}$ through node N1 to both charge and discharge reference capacitor 220, capacitance sensor 200 is not frequency limited due to relaxation error. Accordingly, REF RO 205 and DUT RO 210 can be operated at higher frequencies for reduced electromagnetic interference ("EMI") susceptibility and improved signal to noise ratio ("SNR"). Furthermore, since REF RO 205 can be operated at higher frequencies, REF RO 205 can be reused within a circuit to operate as a synchronous clock signal for other circuit elements (e.g., to clock processor 225).

In one embodiment, drive current $I_{D1}$ driven through node N1 is symmetrical having an equivalent magnitude when sourced out of node N1 via pull up path 405 as when sunk into node N1 via pull down path 410. In one embodiment, drive current $I_{D1}$ is asymmetrical having a different magnitude when sourced out of node N1 via pull up path 405 as when sunk into node N1 via pull down path 410.

Figure 5:
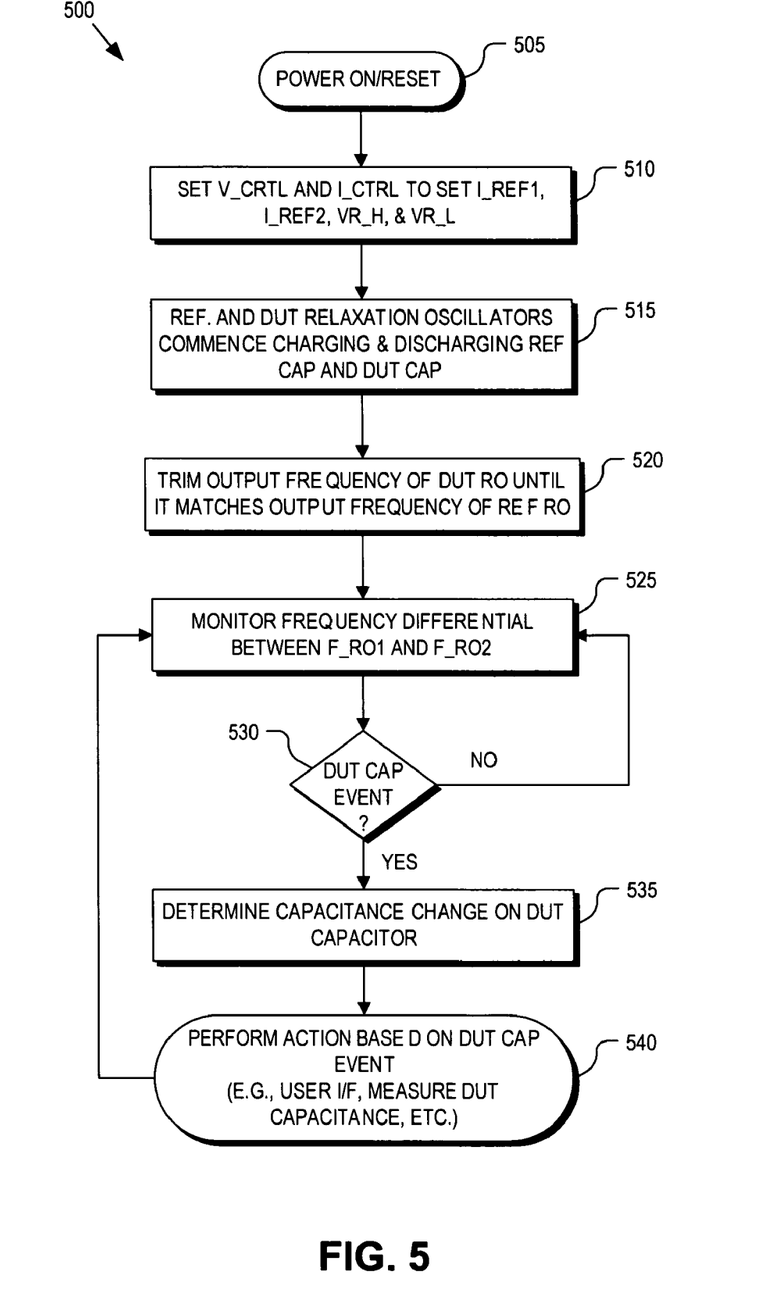
FIG. 5 is a flow chart illustrating operation of a capacitance sensor implemented with dual relaxation oscillators, in accordance with an embodiment of the invention.

FIG. 5 is a flow chart illustrating a process 500 for operating capacitance sensor 200, in accordance with an embodiment of the invention. Process 500 explained below is described in terms of computer software and hardware. The techniques described may constitute machine-executable instructions embodied within a machine (e.g., computer) readable medium, that when executed by a machine will cause the machine to perform the operations described. Additionally, process 500 may be embodied within hardware, such as an application specific integrated circuit ("ASIC") or the like. The order in which some or all of the process blocks appear should not be deemed limiting. Rather, one of ordinary skill in the art having the benefit of the present disclosure will understand that some of the process blocks may be executed in a variety of orders not illustrated.

In a process block 505, capacitor sensor 200 is powered on and/or reset. In a process block 510, processor 225 outputs $I_{CTRL}$ and $V_{CTRL}$ signals to scalers 230 and 240, respectively. In one embodiment, $I_{CTRL}$ and $V_{CTRL}$ are multi-bit digital signals (e.g., 8 bit digital signals) for selecting the analog values for $I_{REF1}$, $I_{REF2}$, $VR_H$, and $VR_L$. Scaler 230 uses $I_{CTRL}$ to generate $I_{REF1}$ and $I_{REF2}$ based on $I_{REF}$ received from current source 235. $I_{CTRL}$ instructs scaler 230 what multiplying factor to apply to $I_{REF}$ to generate the individual reference currents $I_{REF1}$ and $I_{REF2}$. Scaler 240 uses $V_{CTRL}$ to generate $VR_H$ and $VR_L$ based on $V_{REF}$ received from voltage source 245. $V_{CTRL}$ instructs scaler 240 what multiplying factor to apply to $V_{REF}$ to generate $VR_L$ and $VR_H$. Accordingly, processor 225 selects the analog values of $I_{REF1}$, $I_{REF2}$, $VR_H$, and $VR_L$ via its output control signals $V_{CTRL}$ and $I_{CTRL}$. Controls signals $V_{CTRL}$ and $I_{CTRL}$ may initially be set to default values.

In a process block 515, REF RO 205 commences reciprocally charging and discharging reference capacitor 220 in response to $I_{REF1}$, $VR_H$, and $VR_L$. Similarly, DUT RO 210 commences reciprocally charging and discharging DUT capacitor 250 in response to $I_{REF2}$, $VR_H$, and $VR_L$. The frequency of oscillation $f_{RO1}$ and $f_{RO2}$ generated by REF RO 205 and DUT RO 210, respectively, are proportional to their respective load capacitances and the magnitude of their drive currents $I_{D1}$ and $I_{D2}$. In turn, $I_{D1}$ and $I_{D2}$ are related to $I_{REF1}$ and $I_{REF2}$, respectively. Initially $I_{D1}$ and $I_{D2}$ may be set by processor 225 to be equivalent. Accordingly, if there is an initial difference between the oscillation frequencies $f_{RO1}$ and $f_{RO2}$, this difference would be due to a difference in the capacitance loads between reference capacitor 220 and DUT capacitor 250.

In a process block 520, if frequency comparator 215 detects a frequency difference between $f_{RO1}$ and $f_{RO2}$, then DUT RO 210 may be trimmed until $f_{RO1}$ and $f_{RO2}$ are substantially equivalent. In one embodiment, trimming DUT RO 210 may include adjusting $I_{CTRL}$ under control of processor 225 to select a different value for $I_{REF2}$ until $f_{RO1}$ equals $f_{RO2}$ or $\Delta f=0$. At this point, since the absolute capacitance of reference capacitor 220 is a fixed known value, the amount of offset applied to $I_{REF2}$ may be used by processor 225 to calculate the absolute capacitance of DUT capacitor 250. In this manner, capacitance sensor 220 may be used within testing equipment to measure the absolute capacitance of a device under test.

In a process block 525, frequency comparator 215 may continue to monitor the frequency differential $\Delta f$ between $f_{RO1}$ and $f_{RO2}$ and provide real-time feedback to processor 225. In this manner, capacitance sensor 200 may be used to implement a user interface, such as a capacitive touch wheel/dial/pad/button, or the like. For example, capacitive touch wheels operate by using an operator's finger to change its capacitive load (i.e., the capacitive load of DUT capacitor 250). As the operator's finger is pressed against the touch interface, the change in capacitance is sensed and fed back to a control system.

In a decision block 530, a DUT capacitor event is any significant change in the capacitive load of DUT capacitor 250. Capacitance sensor 200 continues to wait until processor 225 registers a DUT capacitor event (e.g., finger touch), at which point process 500 continues to a process block 535.

In process block 535, frequency comparator 215 measures the frequency differential $\Delta f$ resulting from the DUT capacitor event and feeds this information to processor 225. As discussed above, processor 225 can determine the change of capacitance $\Delta C$ of DUT capacitor 250 based on the magnitude of $\Delta f$ resulting from the DUT capacitor event. Processor 225 may apply various filtering algorithms to reject false events or insignificant events. In a process block 540, an action may be taken in response to registering a valid DUT capacitor event. An example action may include implementing a user interface, such as moving a cursor on a screen or selecting a menu item.

Figure 6:
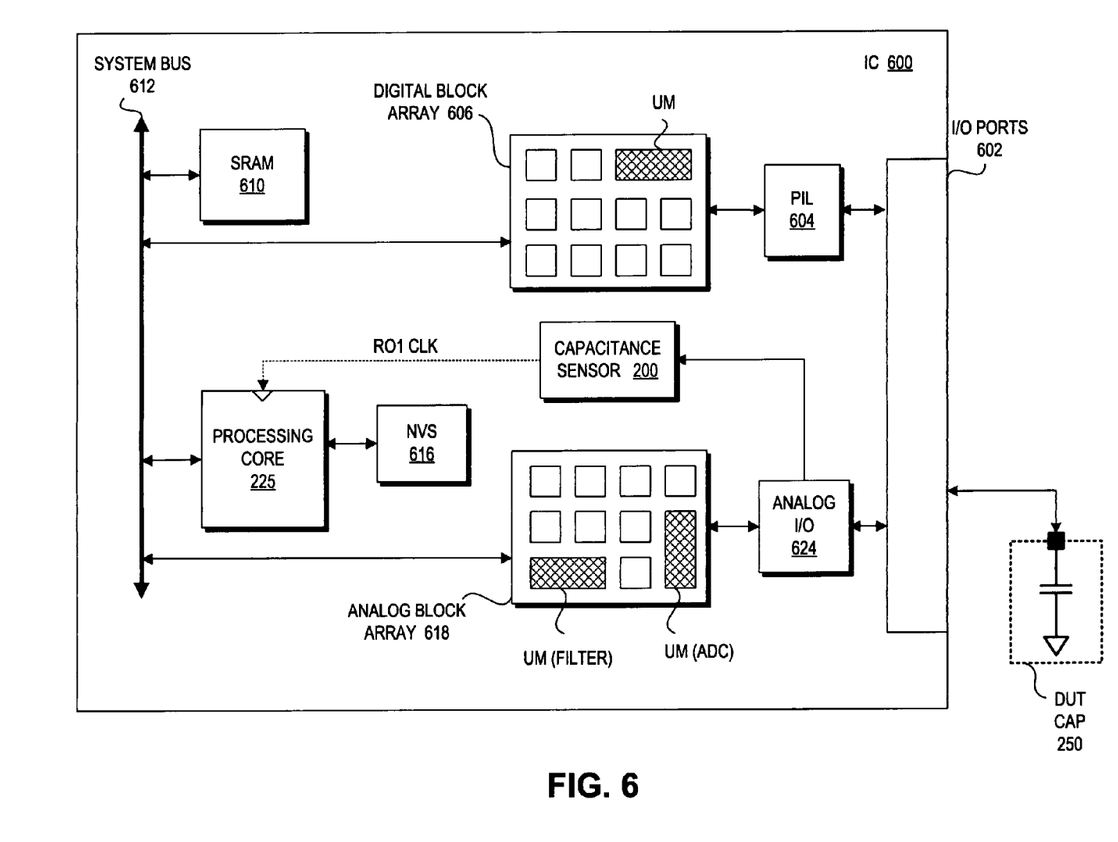
FIG. 6 illustrates a demonstrative integrated circuit for implementing an embodiment of the invention.

FIG. 6 illustrates a demonstrative integrated circuit ("IC") 600 implemented using an embodiment of capacitance sensor 200. IC 600 illustrates a Programmable System on a Chip (PSoC™) microcontroller by Cypress Semiconductor Corporation. The illustrated embodiment of IC 600 includes input/output ("I/O") ports 602. I/O ports 602 may be programmable. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 612.

Static Random Access Memory ("SRAM") 610 and processor 225 are also coupled to system bus 612. Processor 225 is coupled to non-volatile storage ("NVS") 616 which may be used to store firmware (e.g., control algorithms executable by processor 225 to implement process 500).

An analog block array 618 is coupled to system bus 612. Analog block array 618 also may be configured to implement a variety of analog circuits (e.g., ADC, analog filters, etc.) using configurable UMs. Analog block array 618 is also coupled to an analog I/O unit 624 which is coupled to I/O ports 602.

As illustrated, capacitance sensor 200 may be incorporated into IC 600 and coupled to analog I/O unit 624 for coupling to an externally coupled DUT capacitor 250 via I/O ports 602. In one embodiment, RO1 CLK output by REF RO 205 may optionally be used to clock the synchronous components of processor 225. Using REF RO 205 to clock processor 225 and operate capacitance sensor 200 eliminates the need for an additional clock circuit for processor 225, thereby eliminating a redundant part within IC 600.

As described above, capacitance sensor 200 may be incorporated into IC 600, as well as, various other integrated circuits. Descriptions of capacitance sensor 200 may be generated and compiled for incorporation into other integrated circuits. For example, behavioral level code describing capacitance sensor 200, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 200.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a comparator circuit with hysteresis including a first input and an output;
   a capacitor coupled to the first input of the comparator circuit with hysteresis;
   a current driver coupled to the output of the comparator circuit with hysteresis and to the capacitor, the current driver to reciprocally source and sink a drive current through a terminal of the capacitor to oscillate a voltage potential at the terminal of the capacitor between a low reference potential and a high reference potential responsive to the output of the comparator circuit with hysteresis;
   a processor coupled to execute instructions;
   a current source to generate a first reference current; and
   a scaler unit coupled to receive a digital current control signal from the processor and to selectively scale the first reference current in response to the digital current control signal to generate a second reference current to provide to the current driver.

2. The apparatus of claim 1, wherein a magnitude of the drive current is dependent upon the second reference current.

3. The apparatus of claim 1, wherein the comparator circuit with hysteresis comprises:
   a flip-flop including first and second inputs and an output, the output of the flip-flop coupled to the current driver;
   a first comparator including an output coupled to the first input of the flip-flop, a first input coupled to the capacitor, and a second input to receive the high reference potential; and
   a second comparator including an output coupled to the second input of the flip-flop, a first input coupled to the first input of the first comparator, and a second input to receive the low reference potential.

4. The apparatus of claim 3, wherein the current driver includes:

a pull up path coupled between a first voltage rail and the terminal of the capacitor to source the drive current into the terminal of the capacitor, the pull up path responsive to the output of the flip-flop; and a pull down path coupled between a second voltage rail and the terminal of the capacitor to sink the drive current from the terminal of the capacitor, the pull down path responsive to the output of the flip-flop.

5. The apparatus of claim 4, wherein the current driver further includes a current mirror circuit to mirror a reference current into the pull up and pull down paths.

6. The apparatus of claim 5,
wherein the pull up path includes first and second positive metal oxide semiconductor ("PMOS") transistors coupled in series, a gate of the first PMOS transistor coupled to the output of the flip-flop,
wherein the pull down path includes first and second negative metal oxide semiconductor ("NMOS") transistors coupled in series, a gate of the first NMOS transistor coupled to the output of the flip-flop,
wherein the mirror circuit includes a third PMOS transistor coupled between the first voltage rail and a reference current source, the third PMOS transistor having its gate and source coupled to a gate of the second PMOS transistor, and
wherein the mirror circuit includes a third NMOS transistor coupled between the second voltage rail and the reference current source, the third NMOS transistor having its gate and drain coupled to a gate of the second NMOS transistor.

7. A method to sense a capacitance, comprising:
charging and discharging a reference capacitor with a first drive current generated by a first oscillator oscillating at a first frequency;
charging and discharging a device under test ("DUT") capacitor with a second drive current generated by a second oscillator oscillating at a second frequency, wherein the first and second drive currents are scaled from a common reference current; and
measuring a capacitance change across the DUT capacitor based on a relative change between the first and second frequencies.

8. The method of claim 7, further comprising:
generating a low voltage reference at which the first and second oscillators transition between discharging and charging the reference and DUT capacitors, respectively; and
generating a high voltage reference at which the first and second oscillators transition between charging and discharging, the reference and DUT capacitors, respectively.

9. The method of claim 8, further comprising:
generating a reference current; and
mirroring the reference current into the first and second oscillators to generate the first and second drive currents for charging and discharging the reference capacitor and the DUT capacitor, respectively.

10. The method of claim 8, wherein the low and high voltage references are selectable via a processor.

11. The method of claim 10, wherein the processor is clocked by the first oscillator at the first frequency.

12. The method of claim 8, further comprising:
generating a first reference current;
mirroring the first reference current into the first oscillator to generate the first drive current for charging and discharging the reference capacitor;
generating a second reference current;

mirroring the second reference current in the second oscillator to generate the second drive current for charging and discharging the DUT capacitor;
adjusting one of the first reference current or the second reference current until the first frequency of the first oscillator matches the second frequency of the second oscillator; and
computing the absolute capacitance of the DUT capacitor based at least in part on a current difference between the first and second reference currents when the first and second frequencies match.

13. The method of claim 7, wherein measuring the capacitance change across the DUT capacitor based on the relative change between the first and second frequencies includes:
generating a first clock pulse by the first oscillator;
dividing a second clock pulse generated by the second oscillator by N to generate N second clock pulses; and
counting the number of N second clock pulses that occur during a first clock pulse.

14. A capacitance sensor, comprising:
a first oscillator coupled to charge and discharge a reference capacitor with a first drive current at a first frequency, the first oscillator including:
a comparator circuit with hysteresis including a first input coupled to the reference capacitor and an output; and
a current driver coupled to the output of the comparator circuit with hysteresis and to the reference capacitor, the current driver to reciprocally source and sink the first drive current through a terminal of the reference capacitor to oscillate a voltage potential at the terminal of the reference capacitor between a low reference potential and high reference potential responsive to the output of the comparator circuit with hysteresis;
a second oscillator to charge and discharge a device under test ("DUT") capacitor with a second drive current at a second frequency; and
a frequency comparator coupled to the first and second oscillators to output a signal indicative of a capacitance change across the DUT capacitor based on a frequency difference between the first and second frequencies.

15. The capacitance sensor of claim 14, further comprising:
a voltage source to generate a reference voltage;
a voltage scaler coupled to scale the reference voltage to generate a low voltage reference and a high voltage reference, the voltage scaler coupled to provide the low and high voltage references to the first and second oscillators, wherein the first and second oscillators are coupled to oscillate the reference capacitor and the DUT capacitor between the low and high voltage references;
a reference current source to generate a first reference current; and
a current scaler coupled to scale the first reference current to generate second and third reference currents, wherein the first and second oscillators mirror the second and third reference currents, respectively, to generate the first and second drive currents, respectively.

16. The capacitance sensor of claim 15, further comprising a processor coupled to execute instructions, the processor coupled to the voltage and current scalers to select scaling factors for generating the low and high voltage references and for generating the second and third reference currents.

17. The capacitance sensor of claim 16, wherein the first oscillator is further coupled to provide a clock signal having the first frequency to the processor.

18. The capacitance sensor of claim 14, wherein the frequency comparator includes:
   a divider circuit coupled to receive a clock signal from the second oscillator having the second frequency and to divide the clock signal by $2^N$ to generate a divided clock signal; and
   an N-bit register counter coupled to count a number pulses of the divided clock signal that occur during a single pulse of a reference clock signal generated by the first oscillator and having the first frequency.

19. The capacitance sensor of claim 14, wherein the comparator circuit with hysteresis comprises:
   a flip-flop including first and second inputs and an output, the output of the flip-flop coupled to the current driver;
   a first comparator including an output coupled to the first input of the flip-flop, a first input coupled to the capacitor, and a second input to receive the high reference potential; and
   a second comparator including an output coupled to the second input of the flip-flop, a first input coupled to the first input of the first comparator, and a second input to receive the low reference potential.

20. The capacitance sensor of claim 14, wherein the first and second drive currents are each asymmetrical for charging and discharging.

* * * * *